United States Patent
Yang

(10) Patent No.: US 9,013,172 B2
(45) Date of Patent: Apr. 21, 2015

(54) APPARATUS AND METHOD FOR DETECTING FREQUENCY

(71) Applicant: Samsung Electro-Mechanics Co., Ltd., Suwon, Gyunggi-do (KR)

(72) Inventor: Wan Cheol Yang, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 179 days.

(21) Appl. No.: 13/871,727

(22) Filed: Apr. 26, 2013

(65) Prior Publication Data

US 2014/0232371 A1 Aug. 21, 2014

(30) Foreign Application Priority Data

Feb. 19, 2013 (KR) .......................... 10-2013-0017497

(51) Int. Cl.
  *G01R 13/02* (2006.01)
  *G01R 19/00* (2006.01)
  *G01R 23/02* (2006.01)
  *G01R 21/127* (2006.01)

(52) U.S. Cl.
  CPC .............. *G01R 23/02* (2013.01); *G01R 21/127* (2013.01)

(58) Field of Classification Search
  CPC ... H03L 7/081; H03L 2207/10; H03L 7/0812; H03L 7/091; H03L 7/093; H03L 7/16; H03L 7/1976; H03L 7/235; G01R 21/127; G01R 23/02; G01R 23/20; G01R 27/28; G01R 29/26; G01R 31/025; G01R 31/1272; G01R 31/31709

See application file for complete search history.

(56) References Cited

U.S. PATENT DOCUMENTS

| 5,802,123 | A  | * | 9/1998  | Yoshimura et al. ........... 375/376 |
|-----------|----|---|---------|-------------------------------------|
| 5,901,219 | A  | * | 5/1999  | Cason ...................... 379/373.01 |
| 6,181,092 | B1 | * | 1/2001  | Turner ..................... 318/400.32 |
| 6,496,549 | B1 | * | 12/2002 | Crawford ..................... 375/320 |
| 2007/0047688 | A1 |  | 3/2007  | Sung et al. |
| 2010/0110848 | A1 | * | 5/2010 | Honma ...................... 369/47.48 |
| 2012/0217821 | A1 |  | 8/2012 | Bin Jamlus et al. |
| 2012/0326751 | A1 |  | 12/2012 | Kurokawa |

FOREIGN PATENT DOCUMENTS

| KR | 1999-0038614 | 6/1999 |
| KR | 10-2007-0024240 A | 3/2007 |
| KR | 10-2012-0090004 A | 8/2012 |
| KR | 10-2012-0092601 A | 8/2012 |

* cited by examiner

*Primary Examiner* — Vinh Nguyen

(74) *Attorney, Agent, or Firm* — McDermott Will & Emery

(57) ABSTRACT

There are provided an apparatus and a method for detecting a frequency, the apparatus including a signal converting unit removing a high frequency component from an input signal and then converting the input signal into a digital signal, an edge detecting unit detecting an edge of the digital to thereby generate an edge detection signal having a predetermined magnitude, and a frequency estimating unit generating a pulse signal based on the edge detection signal and averaging the pulse signal at a predetermined interval to thereby estimate a frequency of the input signal.

14 Claims, 5 Drawing Sheets

APPARATUS AND METHOD FOR DETECTING FREQUENCY

CROSS-REFERENCE TO RELATED APPLICATIONS

This application claims the priority of Korean Patent Application No. 10-2013-0017497 filed on Feb. 19, 2013, in the Korean Intellectual Property Office, the disclosure of which is incorporated herein by reference.

BACKGROUND OF THE INVENTION

1. Field of the Invention

The present invention relates to an apparatus and a method for detecting a frequency.

2. Description of the Related Art

A power meter is an apparatus capable of sensing an amount of consumed current using a current detection sensor and determining a total power amount by calculating the amount of consumed current by a predetermined voltage. Recently, interest in smart grids, next generation intelligent power networks capable of optimizing energy efficiency by bidirectionally exchanging real-time information between a power supplier and a power consumer through a combination of existing power networks and information technology devices, has increased. In accordance with a digitalization of power networks, consumers may check related information such as rates varying depending on a power supply and demand situation, or the like, and an energy source may be selected in real time, with a separate power management apparatus known as a smart meter.

In order to accurately determine the amount of power consumed in a power meter, a frequency of a signal input from a power line should be precisely detected. Therefore, in the related art such as the following Related Art Document, the frequency of a signal input from a power line has been detected using a zero crossing detection (ZCD) method, a method of detecting the frequency of the signal input from a power line from a crossing point of the input signal and a reference signal line having a zero level.

However, a power load having various forms may flow in power lines, such that an input signal may be introduced with a harmonic wave having a complicated form. As a result, the input signal may have a distorted form very different from that of an ideal sine wave. In this case, a plurality of zero crossing points may be present in a single period, according to conditions of a harmonic wave signal, such that precision in detecting the zero crossing point of ZCD may be decreased.

In order to solve the above-described problem, a method of measuring the frequency of a signal using a high frequency signal faster than a sampling frequency in an analog region, or over-sampling or interpolating in a digital region, has been used. However, even in such a case, since an operation clock frequency is increased, an amount of consumed power may be increased.

RELATED ART DOCUMENT

Korean Patent Laid-Open Publication No. 10-2007-0024240

SUMMARY OF THE INVENTION

An aspect of the present invention provides an apparatus and a method for detecting a frequency, estimating a frequency of an input signal by generating a digital signal from an input signal from which high frequency component has been removed, converting an edge of the digital signal into a pulse signal, and then averaging the pulse signal at a predetermined interval.

According to an aspect of the present invention, there is provided an apparatus for detecting a frequency, the apparatus including: a signal converting unit removing a high frequency component from an input signal and then converting the input signal into a digital signal; an edge detecting unit detecting an edge of the digital signal to thereby generate an edge detection signal having a predetermined magnitude; and a frequency estimating unit generating a pulse signal based on the edge detection signal and averaging the pulse signal at a predetermined interval to thereby estimate a frequency of the input signal.

The signal converting unit may include: a low pass filter removing the high frequency component from the input signal; and an analog-to-digital converter converting an output signal of the low pass filter into the digital signal.

The edge detecting unit may detect rising and falling edges of the digital signal to thereby generate rising and falling edge detection signals.

The rising and falling edge detection signals may have positive and negative values, respectively, and have the same magnitude as each other.

The frequency estimating unit may average the pulse signal at a predetermined interval to calculate an average value, and then compare the average value with a preset data table to estimate the frequency of the input signal.

The frequency estimating unit may include: a pulse signal generating unit generating the pulse signal based on the edge detection signal; an average value calculating unit calculating the average value from the pulse signal; and a comparing unit comparing the average value with the data table to calculate the frequency of the input signal.

The edge detection signal may include the rising and falling edge detection signals, and the pulse signal generating unit may perform an absolute value operation on the rising and falling edge detection signals to generate the pulse signal.

According to an aspect of the present invention, there is provided a method of detecting a frequency, the method including: converting an input signal into a digital signal; generating an edge detection signal having a predetermined magnitude by detecting an edge of the digital signal; and estimating a frequency of the input signal by generating a pulse signal based on the edge detection signal and averaging the pulse signal at a predetermined interval.

In the converting of the input signal into the digital signal, a high frequency component maybe removed from the input signal and the input signal may then be converted into the digital signal.

In the generating of the edge detection signal, rising and falling edges of the digital signal may be detected to thereby generate rising and falling edge detection signals.

The rising and falling edge detection signals may have positive and negative values, respectively, and have the same magnitude as each other.

In the estimating of the frequency of the input signal, the pulse signals maybe averaged at a predetermined interval to calculate an average value, and the average value is then compared with a preset data table to estimate the frequency of the input signal.

The estimating of the frequency of the input signal may include: generating the pulse signal based on the edge detection signal; calculating the average value from the pulse signal; and comparing the average value with the data table.

The edge detection signal may include the rising and falling edge detection signals, and in the generating of the pulse signal, an absolute value operation may be performed on the rising and falling edge detection signals to generate the pulse signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
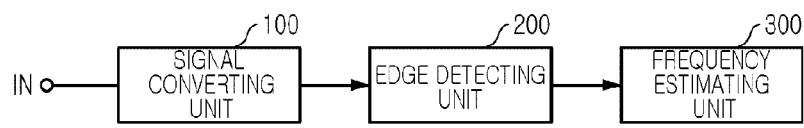
FIGS. 1 and 2 are block diagrams showing an apparatus for detecting a frequency according to an embodiment of the present invention.

FIG. 1 is a block diagram schematically showing an apparatus for detecting a frequency according to an embodiment of the present invention. The apparatus for detecting the frequency may include a signal converting unit 100, an edge detecting unit 200, and a frequency estimating unit 300.

The signal converting unit 100 receives an input signal provided from the outside through an input terminal IN. The apparatus for detecting the frequency included in a power meter is provided with the input signal through an external power line. In this case, the input signal is introduced with a harmonic signal through various power loads connected to the power line. The signal converting unit 100 removes a high frequency component of the harmonic signal from the input signal to recover the input signal to sine wave form, and then converts the input signal, an analog signal, into a digital signal. The digital signal is generated after removing the high frequency component from the input signal, such that precision in detecting the frequency thereof may be improved.

The edge detecting unit 200 receives the digital signal generated from the signal converting unit 100 and detects an edge of the digital signal to generate an edge detection signal.

The edge detection signal includes a rising edge detection signal and a falling edge detection signal respectively generated at a rising time and a falling time of the digital signal. In this case, the rising and falling edge detection signals have the same magnitude as each other, but different values. That is, based on a zero level, the rising edge detection signal has a positive value and the falling edge detection signal has a negative value.

The frequency estimating unit 300 generates a pulse signal having a predetermined magnitude based on the edge detection signal. In this case, the pulse signal corresponds to a signal generated by respectively performing an absolute value operation on the rising and falling edge detection signals which are generated from the edge detecting unit 200. After generating the pulse signal, the frequency estimating unit 300 averages the pulse signal at a predetermined interval to calculate an average value, and compares the calculated average value with a preset data table to estimate the frequency of the input signal.

Figure 2:
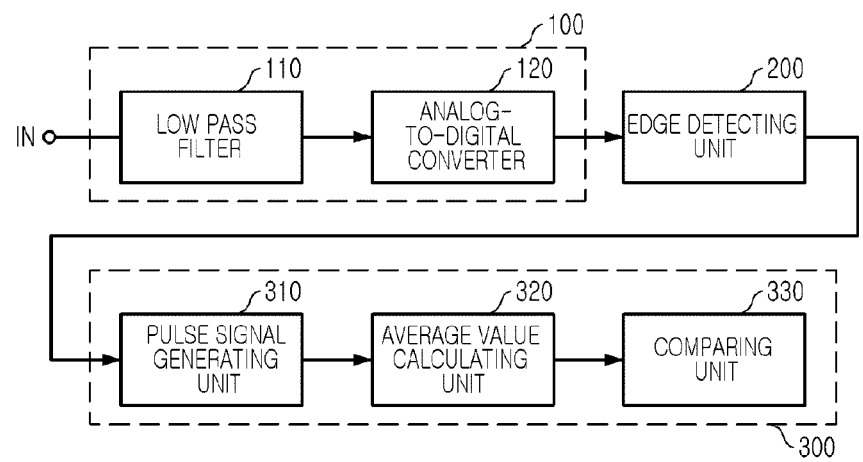

FIG. 2 is a block diagram specifically showing the apparatus for detecting a frequency according to the embodiment of the present invention. Referring to FIG. 2, the signal converting unit 100 includes a low pass filter 110 and an analog-to-digital (A/D) converter 120, and the frequency estimating unit 300 includes a pulse signal generating unit 310, an average value calculating unit 320, and a comparing unit 330. The edge detecting unit 200 shown in FIG. 2 is the same as the edge detecting unit 200 shown in FIG. 1. Therefore, a detailed description thereof will be omitted.

The low pass filter 110 receives the input signal and removes the high frequency component of the harmonic signal from the input signal, thereby recovering the input signal to the sine wave form. Next, the analog-to-digital converter 120 converts the input signal from which the high frequency component has been removed into the digital signal.

The pulse signal generating unit 310 generates the pulse signal by performing the absolute value operation on the rising and falling edge detection signals output from the edge detecting unit 200. The average value calculating unit 320 averages the pulse signal at a predetermined interval to calculate an average value, and the comparing unit 330 may compare the average value generated from the average value calculating unit 320 with a data table to estimate the frequency of the input signal.

Figure 3:
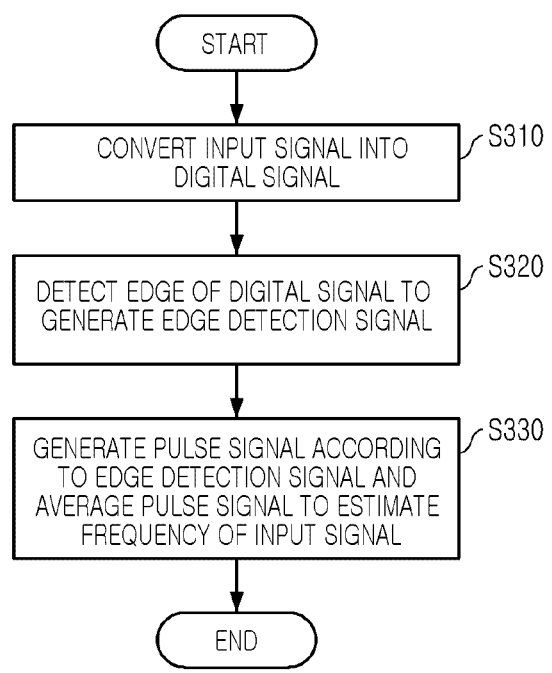
FIGS. 3 and 4 are flowcharts for describing a method of detecting a frequency according to an embodiment of the present invention.
Figure 4:
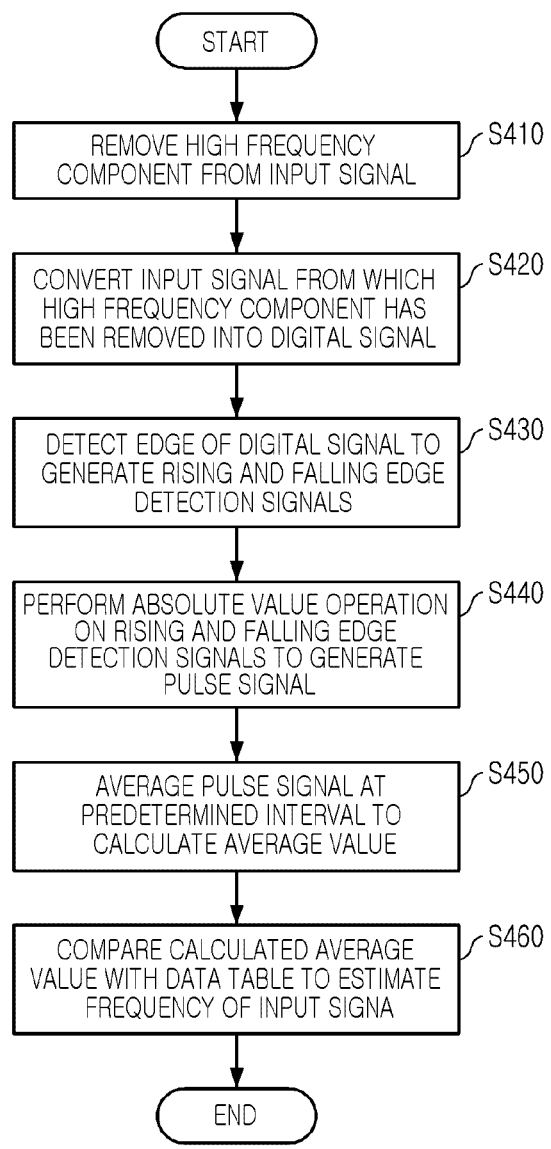

FIGS. 3 and 4 are flowcharts for describing a method of detecting a frequency according to an embodiment of the present invention. FIG. 3 is the flowchart schematically showing the method of detecting the frequency according to the embodiment of the present invention.

Referring to FIG. 3, the method of detecting the frequency according to the embodiment of the present invention starts with converting the input signal into the digital signal in the signal converting unit (S310). Next, the edge signal detecting unit 200 detects the edge of the digital signal generated in S310 to generate the edge detection signal (S320). In this case, as described above, the edge detection signal may be generated at digital rising and falling times. The frequency estimating unit 300 generates the pulse signal according to the edge detection signal generated in S320, and averages the pulse signal to estimate the frequency of the input signal (S330).

FIG. 4 is the flowchart schematically showing the method of detecting the frequency according to the embodiment of the present invention and FIGS. 5A through 5F are graphs showing signals input to and output from respective components of the apparatus for detecting the frequency according to the embodiment of the present invention. Hereinafter, the method of detecting the frequency according to the embodiment of the present invention will be described in more detail with reference to FIG. 4 and FIGS. 5A through 5F.

Figure 5A:
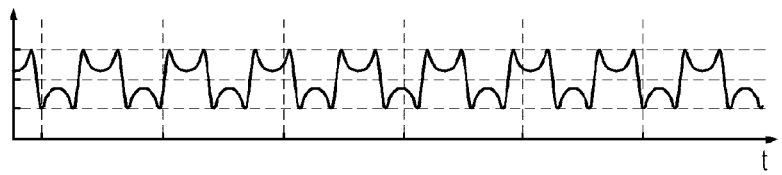
FIGS. 5A through 5F are graphs showing signal forms of signals input or output to/from the respective components of the apparatus for detecting the frequency according to the embodiment of the present invention.
Figure 5B:
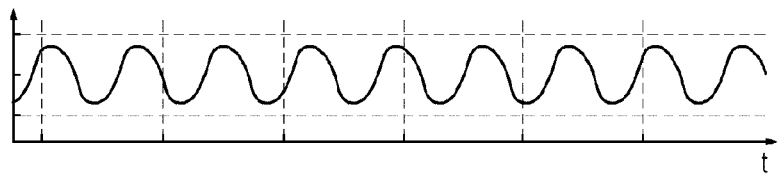

The low pass filter removes the high frequency component from the input signal (S410). Referring to FIG. 5A showing the input signal having the high frequency component included therein, it maybe appreciated that the input signal having the high frequency component included therein has a distorted sine wave form due to the high frequency component. In the case in which the frequency of the input signal is detected using the above-mentioned signal, an error such as a plurality of zero crossing points appearing within one period, and the like may be generated, such that the precision in detecting the frequency thereof is decreased. Therefore, the low pass filter removes the high frequency component from the input signal. FIG. 5B shows a signal having a sine wave form output from the low pass filter 110, which corresponds to a form of an original input signal from which the high frequency component has been removed.

Figure 5C:
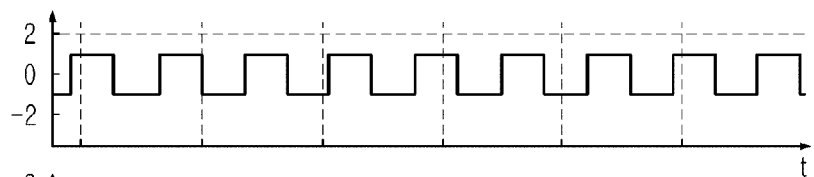

The analog-to-digital converter 120 receives an analog signal (that is, a signal of FIG. 5B) output from the low pass filter 110 to convert the analog signal into the digital signal (S420). In this case, the digital signal generated from the analog-to-digital converter 120 is shown in FIG. 5C.

Figure 5D:
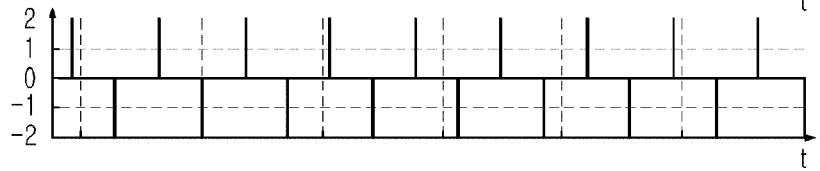

The edge detecting unit 200 detects the rising and falling edges of the digital signal to generate respective rising and falling edge detection signals at the rising and falling times of the digital signal. FIG. 5D is a graph showing the rising and falling edge detection signals output from the edge detecting unit 200. Referring to FIGS. 5C and 5D, it may be appreciated that the rising edge detection signal is output from the edge detecting unit 200 at each rising time of the digital signal output from the analog-to-digital converter 120 and the falling edge detection signal is output from the edge detecting unit 200 at each falling time of the digital signal output from the analog-to-digital converter 120. In this case, it may be appreciated that the rising and falling edge detection signals have the same magnitude as each other, but have values different from each other. Although FIG. 5D shows that the rising and falling edge detection signals have the digital signal of two levels, they may be changed to the digital signal having other levels by a user setting.

Figure 5E:
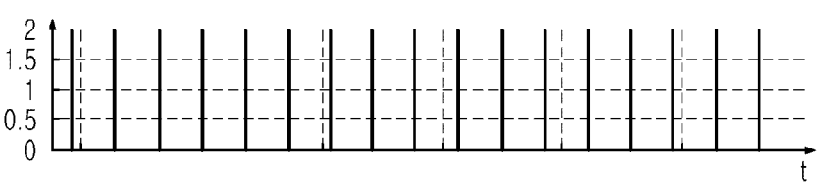

The pulse signal generating unit 310 performs the absolute value operation on the rising and falling edge detection signals output from the edge detecting unit to generate the pulse signal, as shown in FIG. 5E (S440). Referring to FIG. 5E, it may be appreciated that the falling edge detection signal output from the edge detecting unit is inverted by the absolute value operation so as to be output as a signal having a positive value.

Figure 5F:
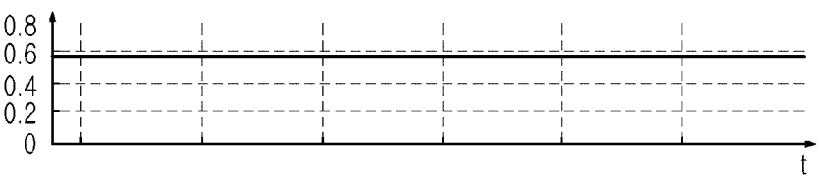

The average value calculating unit 320 averages the pulse signal output from the pulse signal generating unit 310 at a predetermined interval to calculate the average value (S450). That is, energy density of the pulse signal corresponding to a predetermined period may be obtained, wherein the average value calculating unit 320 may precisely measure a frequency change of the input signal by setting the predetermined period to be shorter than a period of the input signal. FIG. 5F is a graph showing the average value calculated by the average value calculating unit 320.

The comparing unit 330 compares the average value calculated by the average value calculating unit with the preset data table to estimate the frequency of the input signal (S460). That is, the comparing unit 330 matches the average value corresponding to about 0.58 in FIG. 5F to a value of the preset data table to estimate the input signal. Although the embodiment of the present invention described above describes that the comparing unit matches the obtained average value to a value of the preset data table, it is also possible to estimate the frequency of the input signal by substituting the obtained average value into a preset function or the like in another embodiment of the present invention.

S310 of FIG. 3 described above corresponds to S410 and S420 of FIG. 4, S320 of FIG. 3 corresponds to S430 of FIGS. 4, and S330 of FIG. 3 corresponds to S440, S450, and S460 of FIG. 4. In addition, although FIGS. 3 and 4 describe that the respective operations are sequentially performed, it is intended only to describe the embodiment of the present invention by way of example. That is, those skilled in the art to which the present invention pertains may make various modifications and alterations by performing operations in a sequence changed from the sequence shown in FIGS. 3 and 4 or performing one or more of the respective operations in parallel, without departing from the scope of the essential characteristics of the embodiment of the present invention.

Figure 6A:
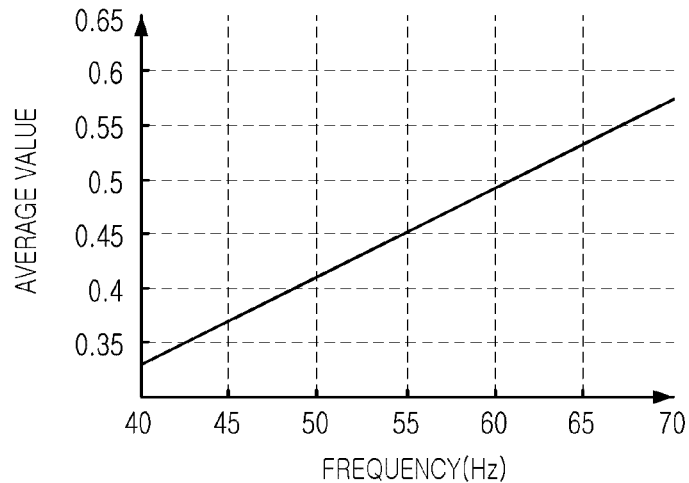
FIGS. 6A and 6B are graphs showing a simulation result of the apparatus for detecting the frequency according to the embodiment of the present invention.
Figure 6B:
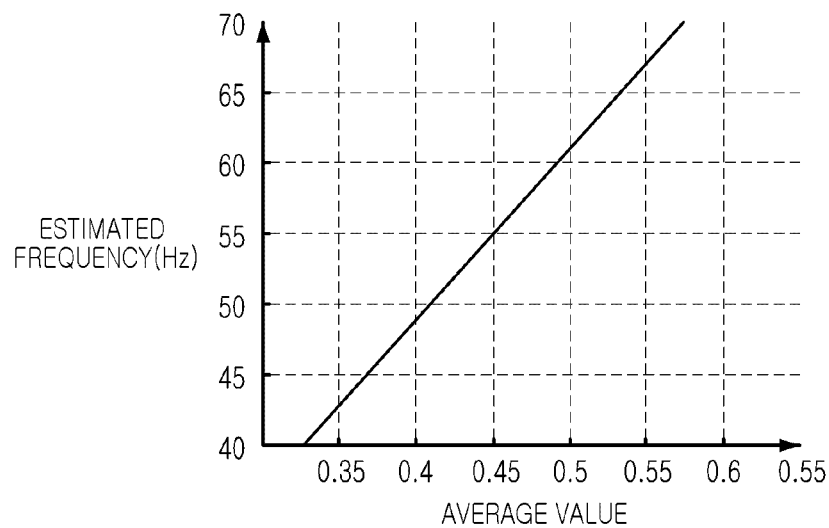

FIGS. 6A and 6B are graphs showing a simulation result of the apparatus for detecting a frequency according to the embodiment of the present invention. FIG. 6A is a graph showing the average value calculated by the average value calculating unit in the case in which the frequency of the input signal is varied to 40 through 70 Hz when assuming that a basic frequency is 50/60 Hz. In FIG. 6A, it may be seen that the average value calculated from the average value calculating unit is monotonically increased in the case in which the frequency of the input signal is varied. This indicates that the frequency of the input signal maybe represented as a linear function for the average value. That is, the average value and the input signal having a linear function relationship are tabled as data in advance, and the comparing unit 330 may then estimate the frequency of the input signal from the input average value.

FIG. 6B is a graph showing the frequency estimated from the apparatus for detecting the frequency according to the embodiment of the present invention. FIG. 6B is a graph, symmetrical with regard to FIG. 6A in such a manner that a Y axis of FIG. 6B equals the X axis of FIG. 6A, and the estimated frequency of the input signal generated according to the average value in FIG. 6B is the same as the frequency of the input signal of FIG. 6A. Therefore, it may be confirmed that the frequency is precisely detected.

As set forth above, according to the embodiment of the present invention, the precision in detecting the frequency may be improved by removing the high frequency components from the input signal and then generating the digital signal therefrom, and the frequency of the input signal may be estimated by converting the edge of the generated digital signal into the pulse signal and then averaging the pulse signal at a predetermined interval, such that the power consumption amount may be decreased as compared to the ZCD method.

While the present invention has been shown and described in connection with the embodiments, it will be apparent to those skilled in the art that modifications and variations can be made without departing from the spirit and scope of the invention as defined by the appended claims.

What is claimed is:

1. An apparatus for detecting a frequency, the apparatus comprising:
    a signal converting unit removing a high frequency component from an input signal and then converting the input signal into a digital signal;
    an edge detecting unit detecting an edge of the digital signal to thereby generate an edge detection signal having a predetermined magnitude; and
    a frequency estimating unit generating a pulse signal based on the edge detection signal and averaging the pulse signal at a predetermined interval to thereby estimate a frequency of the input signal.

2. The apparatus of claim 1, wherein the signal converting unit includes:
    a low pass filter removing the high frequency component from the input signal; and an analog-to-digital converter converting an output signal of the low pass filter into the digital signal.

3. The apparatus of claim 1, wherein the edge detecting unit detects rising and falling edges of the digital signal to thereby generate rising and falling edge detection signals.

4. The apparatus of claim 3, wherein the rising and falling edge detection signals have positive and negative values, respectively, and have the same magnitude as each other.

5. The apparatus of claim 1, wherein the frequency estimating unit averages the pulse signal at a predetermined interval to calculate an average value, and then compares the average value with a preset data table to estimate the frequency of the input signal.

6. The apparatus of claim 5, wherein the frequency estimating unit includes:
 a pulse signal generating unit generating the pulse signal based on the edge detection signal;
 an average value calculating unit calculating the average value from the pulse signal; and
 a comparing unit comparing the average value with the data table to calculate the frequency of the input signal.

7. The apparatus of claim 6, wherein the edge detection signal includes the rising and falling edge detection signals, and
 the pulse signal generating unit performs an absolute value operation on the rising and falling edge detection signals to generate the pulse signal.

8. A method of detecting a frequency, the method comprising:
 converting an input signal into a digital signal;
 generating an edge detection signal having a predetermined magnitude by detecting an edge of the digital signal; and
 estimating a frequency of the input signal by generating a pulse signal based on the edge detection signal and averaging the pulse signal at a predetermined interval.

9. The method of claim 8, wherein in the converting of the input signal into the digital signal, a high frequency component is removed from the input signal and the input signal is then converted into the digital signal.

10. The method of claim 8, wherein in the generating of the edge detection signal, rising and falling edges of the digital signal are detected to thereby generate rising and falling edge detection signals.

11. The method of claim 10, wherein the rising and falling edge detection signals have positive and negative values, respectively, and have the same magnitude as each other.

12. The method of claim 8, wherein in the estimating of the frequency of the input signal, the pulse signals are averaged at a predetermined interval to calculate an average value, and the average value is then compared with a preset data table to estimate the frequency of the input signal.

13. The method of claim 12, wherein the estimating of the frequency of the input signal includes:
 generating the pulse signal based on the edge detection signal;
 calculating the average value from the pulse signal; and
 comparing the average value with the data table.

14. The method of claim 13, wherein the edge detection signal includes the rising and falling edge detection signals, and in the generating of the pulse signal, an absolute value operation is performed on the rising and falling edge detection signals to generate the pulse signal.

* * * * *